United States Patent [19]

Anderson et al.

[11] Patent Number: 5,527,998
[45] Date of Patent: Jun. 18, 1996

[54] FLEXIBLE MULTILAYER PRINTED CIRCUIT BOARDS AND METHODS OF MANUFACTURE

[75] Inventors: David A. Anderson, Northfield; Carol R. Myers, Faribault; Matthew J. Saari, Northfield, all of Minn.

[73] Assignee: Sheldahl, Inc., Northfield, Minn.

[21] Appl. No.: 142,243

[22] Filed: Oct. 22, 1993

[51] Int. Cl.$^6$ ............................................. H05K 1/09
[52] U.S. Cl. .................... 174/255; 174/254; 174/257; 174/258; 174/262; 174/264; 361/792
[58] Field of Search ............................. 174/250, 254, 174/255, 256, 257, 258, 259, 261, 262, 263, 264, 265, 266; 361/748, 784, 790, 792; 439/66

[56] References Cited

U.S. PATENT DOCUMENTS

| | | | |
|---|---|---|---|
| 2,808,352 | 10/1957 | Coleman et al. | 117/227 |
| 3,148,310 | 9/1964 | Feldman | 317/101 |
| 3,181,209 | 5/1965 | Smith | 22/57.4 |
| 3,205,299 | 9/1965 | Dickie | 174/84 |
| 3,320,658 | 5/1967 | Bolda et al. | 29/155.5 |
| 3,334,040 | 8/1967 | Conrad et al. | 204/266 |

(List continued on next page.)

FOREIGN PATENT DOCUMENTS

| | | |
|---|---|---|
| 147856 | 7/1985 | European Pat. Off. . |
| 170703 | 2/1986 | European Pat. Off. . |
| 222618 | 5/1987 | European Pat. Off. . |
| 265212 | 4/1988 | European Pat. Off. . |
| 346525 | 12/1989 | European Pat. Off. . |
| 1065052 | of 0000 | Germany . |
| 55-141733 | 11/1980 | Japan . |
| 1-189196 | 7/1989 | Japan . |
| 1-291405 | 11/1989 | Japan . |
| 4-176193 | 6/1992 | Japan . |
| 4-180292 | 6/1992 | Japan . |
| 4-243195 | 8/1992 | Japan . |
| 2068645 | 8/1981 | United Kingdom . |
| 2123224 | 1/1984 | United Kingdom . |
| 2230903 | 10/1990 | United Kingdom . |
| WO91/14015 | 9/1991 | WIPO . |

OTHER PUBLICATIONS

Electronic Packaging and Production, vol. 29, No. 2, Feb. 1989, Massachusetts US pp. 134–137, XP000007754 K. Gilleo 'A simplified version of the multilayer circuit process' see p. 135–p. 136.

Electronic Packaging and Production, vol. 32, No. 11, Nov. 1992, Massachusetts US pp.34–37, XP000339213 J. Stopperan 'The changing technology of rigid–flexible circuits' see p. 136; figure 1.

Patent Abstracts of Japan vol. 14, No. 320 (E–0950) 10 Jul. 1990 & JP,A,02 106 091 (Hitake Seiko KK) 18 Apr. 1990.

Patent Abstracts of Japan vol. 13, No. 248 (E–770) 9 Jun. 1989 & JP,A,01 048 492 (Sumitomo Electric Ind) 22 Feb. 1989.

(List continued on next page.)

*Primary Examiner*—Laura Thomas
*Attorney, Agent, or Firm*—Merchant, Gould, Smith, Edell, Welter & Schmidt

[57] ABSTRACT

Flexible multilayer printed circuit boards are disclosed which utilize adhesiveless laminates interconnected in a generally superposed relationship by a conductive adhesive. In one embodiment, the adhesiveless laminates have relatively thin conductive layers and metallized through holes which exhibit high delamination resistance. The metallized through holes preferably have a thickness of at most about 25 microns, yet they are capable of withstanding multilayer assembly processes. High flexibility, reliability, packaging density, and environmental resistance are consequently available in a thin multilayer construction. In a further embodiment, adhesiveless dielectric layers are interposed between adhesiveless laminates to electrically insulate portions thereof. The adhesiveless dielectric layers may define relatively small apertures therein, thus providing greater packaging density for a multilayer printed circuit board.

56 Claims, 2 Drawing Sheets

U.S. PATENT DOCUMENTS

| | | | |
|---|---|---|---|
| 3,359,145 | 12/1967 | Salyer et al. | 156/1 |
| 3,421,961 | 1/1969 | Joyce | 156/296 |
| 3,475,213 | 10/1969 | Stow | 117/227 |
| 3,491,056 | 1/1970 | Saunders et al. | 260/41 |
| 3,532,570 | 10/1970 | Cotter | 156/52 |
| 3,541,222 | 11/1970 | Parks et al. | 174/68.5 |
| 3,622,384 | 11/1971 | Davey et al. | 117/212 |
| 3,644,166 | 2/1972 | Gause | 161/89 |
| 3,680,037 | 7/1972 | Nellis et al. | 339/61 M |
| 3,774,232 | 11/1973 | May | 174/52 S |
| 3,795,047 | 3/1974 | Abolafia et al. | 29/625 |
| 3,823,252 | 7/1974 | Schmid | 174/68.5 |
| 3,853,691 | 12/1974 | Caule . | |
| 3,883,213 | 5/1975 | Glaister | 339/61 M |
| 3,885,173 | 5/1975 | Lee | 310/9.4 |
| 3,904,934 | 9/1975 | Martin | 317/101 D |
| 3,971,610 | 7/1976 | Buchoff et al. | 339/17 R |
| 3,982,320 | 9/1976 | Buchoff et al. | 29/630 R |
| 3,984,598 | 10/1976 | Sarazin | 428/336 |
| 3,990,926 | 11/1976 | Konicek | 156/3 |
| 3,998,601 | 12/1976 | Yates et al. | 29/195 |
| 4,037,047 | 7/1977 | Taylor | 174/68.5 |
| 4,064,357 | 12/1977 | Dixon et al. | 174/68.5 |
| 4,064,622 | 12/1977 | Morris et al. | 29/625 |
| 4,064,623 | 12/1977 | Moore | 29/629 |
| 4,065,197 | 12/1977 | Kuist et al. | 339/17 M |
| 4,073,699 | 2/1978 | Hutkin | 204/13 |
| 4,088,544 | 5/1978 | Hutkin | 204/12 |
| 4,091,138 | 5/1978 | Takagi et al. | 428/209 |
| 4,109,377 | 8/1978 | Blazick et al. | 29/626 |
| 4,113,576 | 9/1978 | Hutkin | 204/13 |
| 4,113,981 | 9/1978 | Fujita et al. | 174/88 R |
| 4,169,018 | 9/1979 | Berdan et al. | 204/13 |
| 4,193,849 | 3/1980 | Sato | 204/38 |
| 4,261,042 | 4/1981 | Ishiwatari et al. | 364/709 |
| 4,357,395 | 11/1982 | Lifshin et al. | 428/607 |
| 4,383,003 | 5/1983 | Lifshin et al. | 428/611 |
| 4,407,685 | 10/1983 | Hankland | 156/212 |
| 4,410,388 | 10/1983 | Oizumi et al. | 156/307.3 |
| 4,457,796 | 7/1984 | Needham | 156/182 |
| 4,508,399 | 4/1985 | Dowling et al. | 339/17 CF |
| 4,508,990 | 4/1985 | Essinger | 313/50 |
| 4,511,757 | 4/1985 | Ors et al. . | |
| 4,529,477 | 7/1985 | Lundberg et al. | 156/659.1 |
| 4,554,033 | 11/1985 | Dery et al. . | |
| 4,568,413 | 2/1986 | Toth et al. | 156/151 |
| 4,581,679 | 4/1986 | Smolley | 361/395 |
| 4,608,274 | 8/1986 | Wooten | 427/96 |
| 4,610,756 | 9/1986 | Strobel | 156/645 |
| 4,628,022 | 12/1986 | Ors et al. | 430/280 |
| 4,629,681 | 12/1986 | Takada et al. | 430/314 |
| 4,642,160 | 2/1987 | Burgess | 156/630 |
| 4,645,552 | 2/1987 | Vitriol et al. | 156/89 |
| 4,659,872 | 4/1987 | Dery et al. | 174/117 A |
| 4,670,325 | 6/1987 | Bakos et al. | 428/209 |
| 4,690,833 | 9/1987 | Donson et al. | 427/96 |
| 4,713,494 | 12/1987 | Oikawa et al. | 174/68.5 |
| 4,729,809 | 3/1988 | Dery et al. | 156/306.6 |
| 4,735,847 | 4/1988 | Fujiwara et al. | 428/209 |
| 4,744,850 | 5/1988 | Imano et al. | 156/265 |
| 4,747,211 | 5/1988 | Gilleo et al. | 29/852 |
| 4,771,537 | 9/1988 | Pryor et al. | 29/830 |
| 4,778,635 | 10/1988 | Hechtman et al. | 264/24 |
| 4,788,766 | 12/1988 | Burger et al. | 29/830 |
| 4,800,461 | 1/1989 | Dixon et al. | 361/398 |
| 4,808,435 | 2/1989 | Cropp et al. | 427/97 |
| 4,810,528 | 3/1989 | Kondo et al. | 427/96 |
| 4,812,213 | 3/1989 | Barton et al. | 204/15 |
| 4,814,040 | 3/1989 | Ozawa | 156/634 |
| 4,873,123 | 10/1989 | Canestaro et al. | 427/96 |
| 4,908,940 | 3/1990 | Amano et al. | 29/852 |
| 4,926,549 | 5/1990 | Yoshizawa et al. | 29/876 |
| 4,928,206 | 5/1990 | Porter et al. | 361/385 |
| 4,945,029 | 7/1990 | Bronnenberg | 430/316 |
| 4,959,246 | 9/1990 | Cleemput | 427/97 |
| 4,980,034 | 12/1990 | Volfson et al. | 204/38.4 |
| 5,004,639 | 4/1991 | Desai | 428/138 |
| 5,041,183 | 8/1991 | Nakamura et al. | 156/264 |
| 5,044,053 | 9/1991 | Kopel et al. | 29/25.35 |
| 5,046,238 | 9/1991 | Daigle et al. | 29/830 |
| 5,072,074 | 12/1991 | DeMaso et al. | 174/254 |
| 5,080,929 | 1/1992 | Zachman et al. | 427/97 |
| 5,084,961 | 2/1992 | Yoshikawa | 29/840 |
| 5,095,628 | 3/1992 | McKenney et al. | 29/846 |
| 5,102,343 | 4/1992 | Knight et al. | 439/67 |
| 5,112,462 | 5/1992 | Swisher | 205/165 |
| 5,121,297 | 6/1992 | Haas | 361/398 |
| 5,133,120 | 7/1992 | Kawakami et al. | 29/852 |
| 5,137,791 | 8/1992 | Swisher | 428/612 |
| 5,175,047 | 12/1992 | McKenney et al. | 428/209 |

OTHER PUBLICATIONS

Gilleo, "N New Multilayer Circuit Process Based on Anisotropicity", draft, published in Nepcon West proceeds, (Feb. 1991).

Gilleo, "Anisotropic Adhesives: Screen–printed Electronic Assembly," *IEEE*, pp. 20–23 (Apr. 1988).

Bolger, "Conductive Adhesives", Handbook of Adhesives, pp. 705–712 (date unknown).

Excerpt from IPC–FC–250A International Specification (1985).

"Z–link®" Multilayer Technology Product Specification (date unknown).

"Shel–zac™ Anisotropic Interconnect" Product Specification (Dec. 1991).

*In re Gilleo*, Appeal No. 91–1326 (B.P.A.I. 1991).

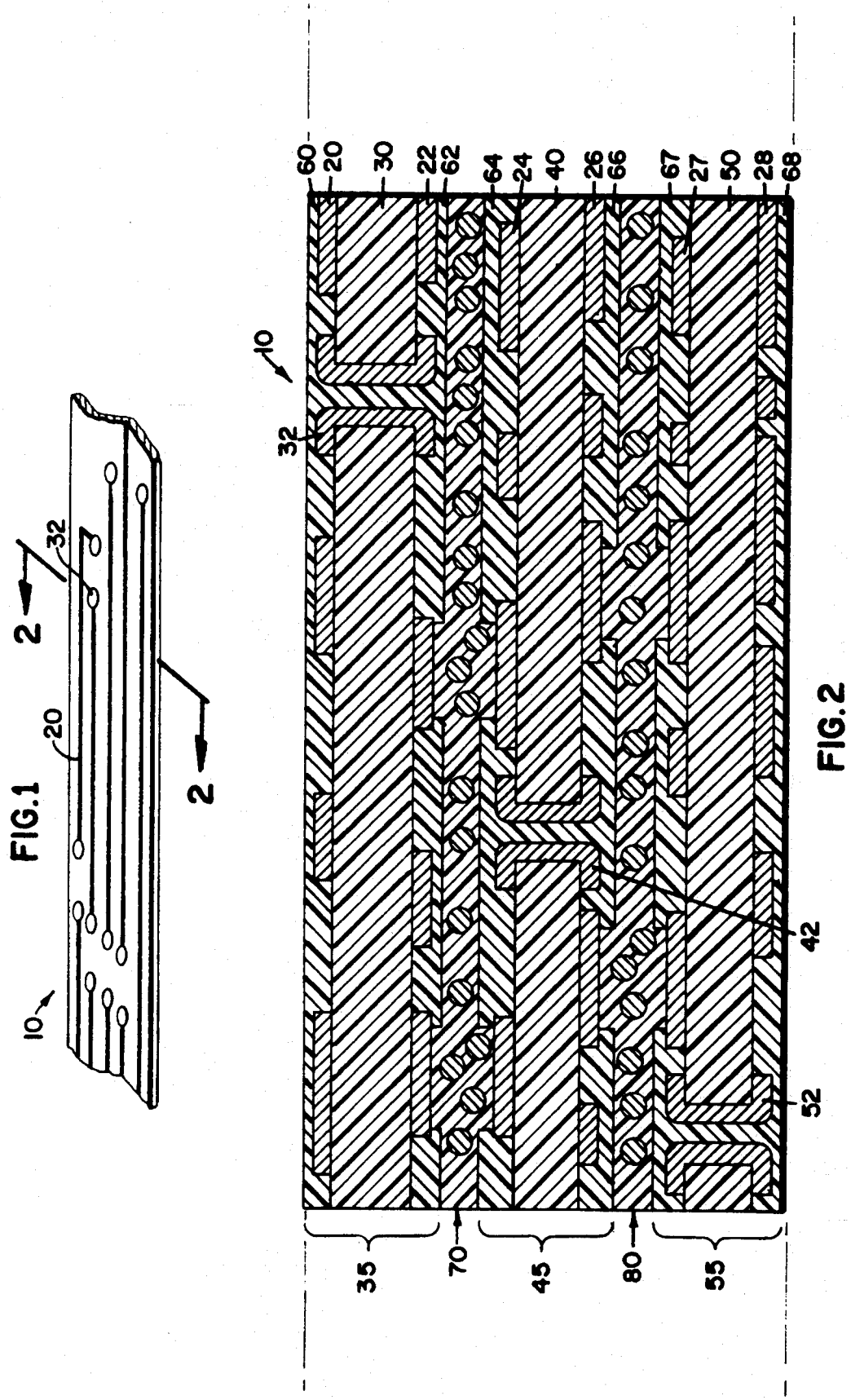

FLEXIBLE MULTILAYER PRINTED CIRCUIT BOARDS AND METHODS OF MANUFACTURE

CROSS-REFERENCE TO RELATED APPLICATIONS

All of the following U.S. Patents and patent applications are assigned to the same assignee as the present invention: U.S. patent application Ser. No. 07/909,058, entitled "Metal-Film Laminate Resistant to Delamination", which is a divisional of U.S. Pat. No. 5,137,791, entitled "Metal-Film Laminate Resistant to Delamination", which is a divisional of U.S. Pat. No. 5,112,462, entitled "Method of Making Metal-Film Laminate Resistant to Delamination"; U.S. patent application Ser. No. 08/091,081, entitled "Method of Making Multilayer Electronic Circuit", which is a continuation of U.S. patent application Ser. No. 925,954 (now abandoned), which is a continuation of U.S. patent application Ser. No. 07/803,202 (now abandoned), which is a divisional of U.S. Patent Application Ser. No. 07/206,086 (now abandoned); U.S. patent application Ser. No. 08/001,811, entitled "Multilayer Electronic Circuit and Method of Manufacture"; U.S. Patent Application Ser. No. 08/002,177, entitled "Multilayer Electronic Circuit and Method of Manufacture"; and U.S. Patent Application Ser. No. 08/087,177, entitled "Rigid-Flex Board With Anisotropic Interconnect and Method of Manufacture".

FIELD OF THE INVENTION

The invention is directed to flexible printed circuits, and more particularly, it is directed to flexible printed circuit boards having multiple interconnected conductive layers.

BACKGROUND OF THE INVENTION

Flexible printed circuit boards (or assemblies) have a wide variety of applications due to their low cost, flexibility and versatility. For instance, flexible printed circuit boards may be used in areas where space is limited, or where the surfaces upon which the printed circuits are mounted are not flat. Further, flexible printed circuit boards may be useful in dynamic applications, where the board is subjected to repeated flexing throughout its life, such as in disk drive heads, printer heads, and display board interconnects for portable computers. Also, when using suitable materials in manufacturing processes, flexible printed circuit boards may be constructed for use in extreme operating environments, such that they exhibit resistance to thermal and chemical exposure.

Typically, flexible printed circuit boards have been limited to single or double-sided constructions in order to provide sufficient flexibility and reliability. However, as packaging densities, processing speeds and information bandwidths have increased, a need has been created for higher density flexible printed circuit boards. One manner to increase the density of a flexible printed circuit board is to utilize three or more conductive layers sandwiched together, which is commonly referred to as a multilayer printed circuit board. By a "conductive layer", we mean a layer of conductive material which is typically arranged into a circuit pattern. A conductive layer may include elements such as signal, power, and ground traces, contact pads, heat sinks, active & passive electronic components, shielding patterns, alphanumeric designs (e.g. part numbers), etc. However, a number of characteristics related to the materials and manufacturing processes used to construct conventional multilayer circuits have made the conventional technology less than optimal for many flexible applications.

Conventional multilayer circuit boards have typically been constructed using adhesives to bond conductive layers to a dielectric substrate, as well as to join dielectric coverlayer films to the assemblies to insulate adjacent conductive layers. The adhesives are typically acrylics or epoxies. However, it has been found that the use of these adhesives in multilayer circuits significantly degrades their performance.

First, the use of adhesives produces relatively thick multilayer circuits. Increased thickness provides reduced flexibility, and may decrease the reliability of the multilayer circuit since many of the layers are located relatively far beyond the neutral axis of the multilayer circuit board, which increases the tension and compression forces to which these layers are subjected during flexing of the board.

The increased thickness of the multilayer circuits due to the use of adhesives also affects the thermal management capabilities of the board, since the ability of a circuit board to dissipate heat is a direct function of the thickness of the board. Decreased thermal management capabilities may result in lower performance and/or life of integrated circuit components which are active on the multilayer circuit board.

Increased thickness of multilayer circuits from the use of adhesives also results in the use of additional processing-steps and additional types and quantities of materials which must be used to construct multilayer circuits. Consequently, the cost of such multilayer circuits is increased.

The thickness of the layers on the multilayer circuit board due to the use of adhesives may also, in certain constructions, limit the packaging density of a multilayer circuit board. For instance, as discussed for example in U.S. patent application Ser. No. 08/001,811, which is assigned to the same assignee as the present invention, when using a conductive adhesive material to join interconnecting pads on two conductive layers through a dielectric coverlayer, it has been found that roughly a 25:1 ratio between the aperture size in the dielectric coverlayer and the connected distance between opposing pads must be utilized to ensure adequate connections with a conductive adhesive. By a "conductive adhesive", which is also often referred to as an "anisotropic adhesive", we mean an adhesive material which conducts through the thickness of the material (z-axis), while electrically insulating throughout the plane of the material (x-axis and y-axis). Since the adhesive material used to bond a dielectric coverlayer film to a substrate is relatively thick, the aperture size must conform to a 25:1 ratio in order to allow compression of the dielectric coverlayer during lamination of the conductive adhesive, which is required because conductive adhesives are not particularly well suited for bridging large distances. Consequently, by having a relatively thick dielectric coverlayer film, the aperture sizes of the electrical connections between conductive layers may waste a significant amount of space on the multilayer circuit board. For instance, using a 50 micron connected distance, the aperture size through this film must be at least 1250 microns. Compared to, for example, a conventional 125 micron conductive trace, it may be seen that the apertures may take up a significant amount of space on a multilayer circuit board.

The use of adhesives in multilayer printed circuit boards also limits the ability of the boards to withstand chemical and thermal extremes. Typically, the adhesives have a significantly greater susceptibility to chemical degradation than many dielectric and conductive materials. Chemical resistance is important in many applications, for instance, in some operating environments (e.g., brake fluid in ABS circuits) and in many common post-processing assembly steps. Also, the adhesives are typically less able to withstand high temperatures compared to the other materials in a multilayer printed circuit board. Further, it is often difficult to match the coefficient of thermal expansion (CTE) of the adhesive with the other materials in a multilayer printed circuit board. Consequently, during thermal cycling, the adhesive may expand at a different rate from the other materials, which may induce thermal stresses in the multilayer printed circuit board, possibly inducing failure of the board. Thus, the use of these adhesives is often a limiting factor on the performance of conventional multilayer printed circuit boards.

Another problem associated with many prior multilayer circuit assembly techniques is the use of high aspect ratio plated through holes to interconnect various conductive layers on a board. Conventional multilayer circuit construction techniques typically interconnect conductive layers by means of plated through holes which are formed throughout the entire thickness of a multilayer printed circuit board. Generally, all of the layers in a board are precisely aligned and bonded together, and then interconnecting holes are drilled, stamped, or otherwise formed at points of interconnection. The holes are then plated to form a conductive barrel structure.

Often, chemical or plasma etching is also required to etch away the substrates in the holes to expose portions of the conductive layers so that an adequate plating surface may be created in the through hole. This is a costly and time-consuming process, and it further increases the diameter of the through holes, wasting additional space on the board.

In multilayer circuits having a number of conductive layers, several problems exist with regard to these plated through holes. First, the holes are more difficult to plate as the aspect ratio (length v. hole diameter) increases, since it is more difficult to get material to adequately bond deeper inside the holes. As holes lengthen, their diameter must be increased to ensure adequate plating, which also wastes additional space on the board. Another problem with the plated through holes is that they may waste a significant amount of space on the multilayer printed circuit board, thus reducing the packaging density of the circuit, since in order to connect two layers in a multilayer circuit board, a hole must be formed through all of the layers in the board regardless of which layers are to be connected.

Another drawback to these high aspect ratio plated through holes is their susceptibility to breakage from z-axis expansion during thermal cycling. As the number of circuit layers increase in a multilayer circuit board, thermal cycling may induce failure in these holes since various materials such as adhesives in a conventional multilayer circuit board expand at different rates and induce thermal stresses in the z-axis of the circuit board. Consequently, it is desirable to limit the length of these holes in order to reduce the possibility of their failure from bending and/or thermal stress.

As a result of the limitations of conventional multilayer fabrication processes, the conventional wisdom has required a minimum of about 1 mil (or about 25.4 microns) of copper to be plated on the conductive layers and in the plated through holes to ensure adequate circuit board performance. MIL-P-50884 military specification for flex circuits, MIL-P-55110 military specification for rigid boards, and IPC 250 commercial specification for class II and class III boards (excluding low reliability, non-critical consumer applications in class I) all require a minimum of 1 mil thickness of copper in multilayer printed circuit boards. Class I devices allow as low as 0.5 mil (12.7 microns) thicknesses; however, low cost is the overriding concern in these applications, rather than reliability. Consequently, the Class I requirements are typically not sufficient for most applications where reliability is a significant concern.

Various adhesiveless laminate technologies have been developed in an attempt to alleviate the drawbacks associated with using adhesives. By "adhesiveless", we mean interconnects formed directly between two layers (an insulator and a conductor), without the inclusion of additional layers of conventionally recognized adhesive materials such as epoxies, acrylics, polyesters, cyanate esters, butyral phenolics, perflouropolymers, aramid perflouropolymers etc. Examples of adhesiveless technologies include application of a conductor to a base dielectric film, as in sputtering, chemical deposition, vacuum deposition, additive plating, or a combination thereof. Application of a dielectric to a base metal foil by casting and curing the liquid dielectric is also possible. However, it has been found that many adhesiveless processes are costly and time consuming, and not particularly suitable for high volume and/or low cost manufacturing. Further, many of these processes are not "dry" processes, and consequently, are not environmentally friendly. Casting processes also suffer from the drawback of having relatively low tear strengths, and it is also generally difficult to construct double-sided laminates by casting processes.

Attempts have also been made at eliminating the adhesive in bonding dielectric coverlayers or substrates in multilayer circuits. For instance, Volfson et al., U.S. Pat. No. 4,980,034; Kondo et al., U.S. Pat. No. 4,810,528; Dakos et al., U.S. Pat. No. 4,670,325; Davey et al., U.S. Pat. No. 3,622,384; European Patent Application 222,618; PCT Application 91/14015; and Japanese Application 4-176193, disclose various uses of screen-printed polyimide inks for use as dielectrics and/or substrates. However, many of these references disclose the use of such polyimide inks in rigid ceramic circuit boards, and many use an additive process to alternately print conductive and polyimide layers to form multilayer circuits. However, it has been generally found that the temperatures and pressures associated with such additive processes are beyond the capabilities of flexible multilayer printed circuit boards, in part due to the limitations of the adhesives and dielectrics used in these aforementioned conventional flexible multilayer circuits. For instance, conventional adhesives are generally unable to withstand the typical 270° C. curing temperature for a dielectric ink. Gilleo et al., U.S. Pat. No. 4,747,211, discloses the use of a dielectric ink on a substrate utilizing polymer thick films to produce flexible multilayer circuits. However, this process is also unsuitable for use with conventional adhesive-based flexible multilayer circuit boards, again in part due to the inability of an adhesive to withstand the post-processing assembly steps associated with this process. European Patent Application 222,618 discloses a similar approach on ceramic substrates, but the 475° C. firing step is unsuitable even for the best adhesiveless flex technologies because of the limitations of polyimide dielectrics.

Consequently, a need exists in the art for flexible multilayer printed circuit boards which generally do not suffer from many of the drawbacks of the conventional multilayer printed circuit boards. Among other needs, such properties as flexibility, reliability, high packaging density, and thermal and chemical resistance are desired. In part, it is desirable to reduce or eliminate the use of adhesives in bonding dielectric and conductive layers to a substrate in the formation of a multilayer circuit in order to reduce or eliminate the various limitations posed by the use of adhesives. It is also desirable to limit the overall thickness of the boards to further improve the above-described properties.

SUMMARY OF THE INVENTION

The present invention addresses these and other problems associated with the prior art in providing thin, reliable, flexible multilayer printed circuit boards in which adhesiveless laminates are interconnected with one another in superposed relationships. Such printed circuit boards of the present invention are capable of high reliability and flexibility, as well as increased packaging density and environmental resistance.

In accordance with one aspect of the invention, there is provided a flexible multilayer printed circuit board which includes at least two adhesiveless laminates mechanically and electrically interconnected in a superposed relationship by a conductive adhesive layer. The adhesiveless laminates include a flexible dielectric substrate, first and second conductive layers of conductive material secured to opposing surfaces of the flexible dielectric substrate through adhesiveless interconnections, and at least one metallized through hole defined through the flexible dielectric substrate and having conductive material deposited thereon to electrically interconnect the first and second conductive layers. The conductive material deposited in the at least one metallized through hole has a thickness of less than about 25 microns.

In accordance with another aspect of the invention, a metal-film laminate for use in a flexible multilayer printed circuit board is provided which includes a flexible dielectric substrate having surfaces bearing non-continuous random distributions of metal-oxide, first and second conductive layers of conductive material secured to opposing surfaces of the flexible dielectric substrate through the non-continuous random distribution of metal-oxide, and at least one metallized through hole defined through the flexible dielectric substrate and having conductive material deposited thereon to electrically interconnect the first and second conductive layers. The conductive material deposited in the at least one metallized through hole has a thickness of less than about 25 microns.

In accordance with a further aspect of the invention, a method of manufacturing a flexible multilayer printed circuit board is provided which includes the steps of constructing at least two adhesiveless laminates and mechanically and electrically interconnecting the adhesiveless laminates in a superposed relationship through a conductive adhesive layer. The step of constructing at least two adhesiveless laminates includes the steps of forming at least one through hole through a flexible dielectric substrate and depositing conductive material on the flexible dielectric substrate to form first and second conductive layers of conductive material on opposing surfaces of the flexible dielectric substrate, and to electrically interconnect the first and second conductive layers through metallizing the at least one through hole. The conductive material is deposited in the at least one through hole to a thickness of less than about 25 microns.

According to another aspect of the invention, a flexible multilayer printed circuit board is provided which includes at least two adhesiveless laminates, an adhesiveless dielectric layer disposed on at least one of the adhesiveless laminates, and interconnecting means for mechanically securing the at least two adhesiveless laminates together in a superposed relationship with the adhesiveless dielectric layer disposed therebetween. The at least two adhesiveless laminates each include at least one conductive layer disposed on the surface of a flexible dielectric substrate, and at least one of these adhesiveless laminates has two conductive layers disposed on opposing surfaces of the flexible dielectric layer.

In accordance with a further aspect of the invention, a method for manufacturing a flexible multilayer printed circuit board of the type having at least two adhesiveless laminates electrically and mechanically interconnected in a superposed relationship by a conductive adhesive layer is provided. This method includes the step of, prior to electrically and mechanically interconnecting the adhesiveless laminates, forming at least one adhesiveless dielectric layer over a conductive layer on at least one of the adhesiveless laminates. The adhesiveless dielectric layer has at least one aperture defined thereon for facilitating an electrical interconnection between the conductive layer and an opposing conductive layer on an adjacent adhesiveless laminate across the conductive adhesive layer.

The present invention is capable of providing thin flexible multilayer printed circuit boards having high reliability, flexibility, and packaging density, as well as high thermal and chemical resistance. Multilayer circuit boards may be constructed utilizing adhesiveless laminates and materials, with thicknesses often below the minimum thickness requirements which are commonly recognized in the art. Further, greater packaging density may be obtained through a reduction in the size of the apertures found in adhesiveless dielectric layers which are utilized in some preferred embodiments of the invention. In addition, the use of conductive adhesive layers between adhesiveless laminates provides a built-in system of blind and buried vias which further increases packaging density.

These and other advantages and features which characterize the invention are pointed out with particularity in the claims annexed hereto and forming a part hereof. However, for a better understanding of the invention, its advantages and objectives obtained by its use, reference should be made to the Drawing which forms a further part hereof and to the accompanying descriptive matter, in which there is described a preferred embodiment of the invention.

BRIEF DESCRIPTION OF THE DRAWING

FIG. 1 is a perspective view of a six layer multilayer printed circuit board consistent with the present invention.

FIG. 2 is a partial cross-sectional view of the multilayer printed circuit board of FIG. 1, taken along lines 2—2 (not drawn to scale).

DETAILED DESCRIPTION OF THE PREFERRED EMBODIMENT

Figure 3:
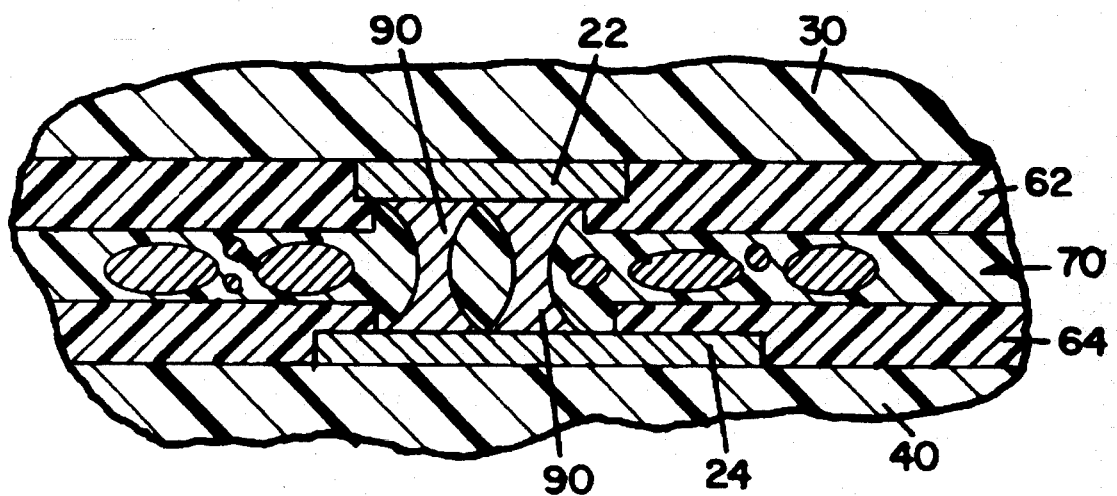
FIG. 3 is an enlarged partial cross-sectional view of the multilayer printed circuit board of FIG. 2, showing in greater detail the solder bridges formed between opposing conductive layers.

A number of the manufacturing techniques used in the production of the preferred flexible multilayer printed circuit board are in part the subject of various patents and patent applications assigned to the same assignee as the present invention. U.S. Pat. Nos. 5,112,462 and 5,137,791 and U.S. patent application Ser. No. 07/909,058 are directed to metal-film laminates. U.S. patent application Ser. Nos. 08/091,081, 08/001,811, 08/002,177, and 08/087,177 are directed to conductive adhesives. The reader is directed to all of these disclosures for a better understanding of the art generally related to this invention. To the extent they are required to support this disclosure, the disclosures of all of these references are incorporated by reference herein.

Turning to the Drawing, wherein like numbers denote like parts throughout the several views, FIGS. 1 and 2 show a preferred flexible multilayer printed circuit assembly 10 consistent with the present invention. Generally, assembly 10 includes three single- or double-sided laminates (35, 45 and 55), coated on one or both sides by dielectric coverlayers (60, 62, 64, 66, 67, 68), and electrically and mechanically joined by conductive adhesive layers (70, 80). However, it will be appreciated that assembly 10 may include any number of laminates and conductive adhesive layers within the scope of the invention, and consequently, preferred assembly 10 is presented for illustrative purposes regarding the various fabrication techniques which are discussed in greater detail below.

Metal-Film Laminates

In the preferred laminates 35, 45 and 55 (shown in FIG. 2), conductive layers such as layers 20 and 22 are deposited on one or more sides of a flexible substrate such as substrate 30 through adhesiveless techniques, and are preferably electrically interconnected by an evaporative through hole metallization process. Further, metallized through holes such as through hole 32 are formed through the substrate to electrically interconnect portions of the conductive layers on the opposing sides of the substrate.

A number of dielectric materials may be used as a substrate in the preferred laminates. Preferably, a dielectric material such as a polymeric film is used as the substrate. Polyimide is the most preferred substrate for use with the invention, however, other dielectric materials such as addition polymers, condensation polymers, natural polymers, treated films, or thermosetting or thermoplastic resins may be used in the alternative. Specifically, such substrate materials as polyethylene naphthalate, polyester or glass epoxy may be used. Rigid substrate materials, such as ceramics or rigid glass epoxy constructions may also be used with the metallized through hole process, however, these rigid materials tend to be more expensive, and do not have the flexibility or thinness to which many of the advantages of the through hole metallization process provides.

Substrate dielectric materials in thicknesses between about 12 and 125 microns are preferred. In particular, polyimide films are commonly available in thicknesses of 25 and 50 microns, among others. While the use of thinner substrate materials provides additional flexibility, such concerns as preventing dielectric breakdown or increasing the ground-to-ground separation for purposes of controlling impedance may require the use of thicker substrate materials.

A number of conductive materials may be used in the conductive layers 20 and 22 deposited on each side of the substrate material 30 in preferred laminate 35. Copper is a preferred conductive material, as it is relatively inexpensive and easy to work with. Alternative conductive materials include aluminum, gold, silver, or other known conductive materials. It has been found, however, that copper has an added advantage in that it has a coefficient of thermal expansion (CTE) that is substantially similar to that of polyimide material. Consequently, double-sided laminates having copper layers on polyimide substrate materials will generally be less susceptible to thermal stresses.

In order to manufacture single or double-sided metal-film laminates with the evaporative through hole metallization process, the first step is to form a number of through holes in a blank dielectric substrate material. These holes may be formed by stamping, laser cutting, drilling, or other known methods. These holes provide electrical connections between conductive layers on opposing sides of the substrate material.

Once the through holes are formed on the substrate, the substrate is next subjected to plasma treatment in a plasma chamber to condition the substrate for the deposition of conductive material on its surfaces. In the plasma chamber, the surfaces of the substrate material are conditioned by forming thin, random, and preferably non-continuous distributions of metal oxide on the surfaces of the substrate. A cathode is included in the plasma chamber which is preferably constructed of a material such as chromium, titanium, iron, nickel, molybdenum, manganese, zirconium, or mixtures thereof, so that oxides of one or more of the above materials may be generated in the plasma chamber and deposited on the surfaces of the substrate. This process enables conductive layers to be bonded to the substrate material in such a fashion that peel strengths in excess of 2 pounds per inch, and even in excess of 10 pounds per inch, may be obtained.

The substrate, thus treated, is next subjected to a vacuum deposition (evaporative) process in order to form thin layers of conductive material on one or both surfaces and in the through holes of the substrate. The vapor metallization (vacuum deposition) process is a known low pressure/high temperature process, where copper or another metal is vaporized at low pressure and high temperature and then deposited upon the surface of the substrate material. In the preferred embodiment, copper is deposited on the treated surfaces and through holes of the polyimide substrate to a thickness of about 50–500 nanometers, most preferably about 200 nanometers. It has been found that this thickness of copper forms a strong base for securely joining later copper layers to the substrate material.

Alternative to vacuum deposition of a first layer of copper, a chemical deposition process, known in the art, may instead be used to bond copper to the treated surfaces of the substrate.

One optional step which may be performed in lieu of or prior to vacuum deposition is the use of a sputtering process to transfer conductive material onto the treated surfaces and through holes of the substrate. In the sputtering process, ions are accelerated against a cathode in low pressure by generating a high electrical potential in a chamber. This causes the cathode material, in this case copper, to be excited and transferred to the substrate material which is oriented so as to receive the sputtered copper. It has been found that this additional step increases the strength of the bonds formed by the through hole metallization process.

One advantage of the use of the vacuum deposition and sputtering in the through hole metallization process is that the plasma treatment, vacuum deposition, and sputtering may all take place in separate zones of the same vacuum chamber. This generally results in higher reliability and lower reject rates due to the reduced handling which is associated by combining these steps into the same chamber. However, one skilled in the art will appreciate that separate chambers may also be used in the alternative.

Once a 50–500 nanometer thin conductive layer is formed on each side and in the through holes of the substrate material, the desired thickness of copper material is preferably formed by an electroplating process that is known in the art. Generally, electroplating involves placing a substrate material in solution supplied with electrical power, and with the substrate material configured as a cathode. The desired conductive material, in this case copper, is present in the solution and is deposited on the substrate by this process. Electroplating is a well known process which provides high reliability and controllability, and it is this process which is used to produce the final desired thickness of conductive material in each side of substrate material 30.

Instead of electroplating, the final thickness of conductive material may be formed by an electroless process which is also generally known in the art. Other methods of depositing conductive material onto a substrate may also be used.

Once layers of conductive material have been formed on the dielectric substrate, patterns are formed thereon using a known etching process. In etching, a layer of resist material is placed on the substrate and selectively exposed by light or other means corresponding to a desired interconnection pattern to be formed on the substrate. The substrate is then exposed to resist and basic etchant baths selectively in order to remove the excess conductive material and leave the final desired conductive patterns on the substrate. Other methods of forming a conductive pattern from a layer of conductive material, such as the semi-additive technique, may also be used.

By virtue of the above process steps, conductive layers 20 and 22 are formed on both sides of dielectric substrate 30, and metallized through holes such as hole 32 are formed to electrically interconnect layers 20 and 22. Similarly, layers 24 and 26 and metallized through hole 42 are formed on substrate 40 for laminate 45, and layers 27 and 28 and metallized through hole 52 are formed on substrate 50 for laminate 55. The conductive layers and metallized through holes may be constructed to have finished thicknesses which fall below the standard minimum thickness requirements of 1 mil (25.4 microns), although greater finished thicknesses, such as 35 microns, are nonetheless obtainable if desired. Preferably, the conductive layers and metallized through holes have a finished thickness of at most about 25 microns, more preferably a finished thickness of at most about 15 microns, even more preferably a finished thickness of at most about 12.5 microns, and most preferably a finished thickness of at most about 5 microns. Other thicknesses may be desirable based upon such considerations as current carrying capacity.

Preferably, the metallized through holes and conductive layers will have the same thickness since they are preferably formed simultaneously by the through hole metallization process. However, one skilled in the art will appreciate that the through holes and conductive layers may be deposited partially or completely independently from one another to varying thicknesses.

Other techniques, or combinations of techniques, may be utilized to produce relatively thin yet durable single- or double-sided metal-film laminates. Any combination of vacuum deposition, chemical deposition, sputtering, plating, and/or other deposition techniques may be used consistent with the invention. Also, other processes for treating a substrate to increase its adhesion properties, including various oxidizing techniques, may also be used consistent with the invention. Further, we believe additive processes may be incorporated in some applications. Any lamination technique, however, will preferably eliminate the need for adhesives to bond the conductive layers to the substrate.

Using the above-described metallized through hole process, a number of benefits are obtained over prior laminate construction methods. Many of these prior processes typically rely on adhesives to bond conductive layers to a substrate; however, the adhesiveless through hole metallization process eliminates the need for adhesives. In many prior systems, base layers of 18 microns of copper or more are typically bonded to a substrate material using 17 microns of adhesive material. In addition, to form through holes with these prior adhesive-based systems, the through holes generally are plated after the base layers of copper are layered onto the substrate. Generally, an additional 25 microns of copper (or as low as 15 microns in some advanced constructions) are plated onto the through holes in order to form electrical interconnections between the opposing sides of the substrate. Consequently, each conductive layer formed on a substrate using these prior adhesive-based systems adds at best about 50–60 microns in thickness.

However, the above-described adhesiveless process is capable of providing reliable, delamination resistant conductive layers and metallized through holes at a thickness of about 5 microns or even less. Consequently, the preferred adhesiveless laminate processes are capable of providing reliable adhesiveless laminates having conductive material thicknesses on the through holes and the conductive layers well below the conventionally-recognized minimums of about 1 mil (25.4 microns) in the barrels and 1 mil plus adhesive thickness plus bonded copper thickness on the surface of the substrate. This offers a significant advantage over prior adhesive-based, as well as cast film adhesiveless laminates in the art due to the increased reliability, flexibility, packaging density, and environmental characteristics which are typically associated with thinner constructions.

The elimination of adhesive in the adhesiveless through hole metallization process provides a number of benefits over prior adhesive-based processes. In general, double-sided laminates fabricated by the through hole metallization process are more resistant to thermal stresses than prior adhesive-based methods, since the adhesive used in these prior methods is generally susceptible to breakdown from elevated temperatures or repeated cycling. When using a temperature resistant substrate material, however, the adhesiveless through hole metallization process is capable of providing excellent thermal resistance, particularly during post-processing assembly and in operating environments subjected to high temperatures and/or repeated cycling. During post-processing assembly, a further advantage is found in that no separate adhesive drying step is required prior to reflow.

Another benefit of the above-described process is a greater chemical stability than is found in prior methods. It has been found that the adhesive used in many prior adhesive-based methods is somewhat susceptible to breakdown from exposure to harsh chemicals, and consequently, the elimination of this adhesive in the adhesiveless process described above allows a wider variety of processing chemicals to be used in post-processing assembly steps and also allows laminates to be used in environments where chemical exposure may be likely.

Stronger through holes are also provided by the above-described process, in part due to the elimination of adhesive which generally degrades the performance of through holes from repeated stresses. Such stresses arise from thermal cycling of the circuit during component assembly or after installation, or they may arise from elevated pressure applied as part of anisotropic interconnection or stiffener bonding. It has been found that assemblies constructed in accordance with the principles of the invention have enabled 5 micron-thick through holes to withstand 35 kg/cm$^2$ of pressure at 180° C. without any barrel deformation or cracking present.

This was not previously possible with an adhesive-based construction.

Other advantages are provided by the preferred process over prior methods due to the relatively lesser thicknesses of conductive layers (i.e., about 5 microns in the preferred constructions versus 50–60 microns in prior adhesive-based assemblies). One advantage is a greater packaging density which may be obtained. This is provided in part based upon the fact that, with the through hole metallization process, the finished copper layer is the same thickness as copper deposited in the through holes. Since more copper is generally plated onto the conductive layers of an adhesive-based process than the through holes, additional copper must be plated around the through holes so that the through holes will survive the later etching processes. Consequently, thicker layers of copper will remain on the surfaces of the substrate when suitable through holes have been constructed. Another key to the increase in packaging density with the preferred process is the fact that etching undercut is minimized by the reduction of surface copper thickness. In prior methods, the etchant material tended to etch horizontally to a greater degree in thicker coppers, requiring wider conductive traces in order to survive the etching process. With the elimination of the adhesive in the preferred process, etching undercut is minimized, and consequently a smaller line resolution may be utilized. Thinner copper also means the valley depth between etched conductors is less, hence the penetration and etching action of chemicals in the valleys may be more evenly controlled, also providing finer resolution. In fact, using the preferred process, the limits on line resolution are no longer dependent upon the thickness of the copper layer on the substrate, but are limited instead by the resolution capability of the etch resist material.

The above-described evaporative metallized through hole process provides another benefit over other adhesive-based, as well as adhesiveless processes in that the evaporative metallized through hole process is readily adaptable for high volume and/or low cost applications. The number of steps and materials, as well as the time to perform each of the steps, in the metallized through hole process is generally less than many prior methods. Also, the process is characterized as a "dry" method, which is more environmentally friendly than many other techniques. Consequently, the metallized through hole process may be utilized in a wider variety of applications, with reduced economic restraints compared to many prior laminate technologies.

Another important benefit of the thinner copper layers produced by the preferred process is the increased flexibility and reliability of the finished laminates over prior, thicker assemblies. As discussed above, the preferred laminates are capable of having conductive thicknesses well below the conventionally recognized minimum thickness. The ability of a flexible substrate to withstand repeated and/or narrowed radius bends and resist delamination is important in many applications, most notably dynamic flex applications such as disk drive read/write heads, printer heads, and display interconnects for portable, laptop, notebook and sub-notebook computers. In general, the thinner a laminate, the more flexible it is, and the less it is subjected to tension or compression forces produced by bending. Consequently, the thinner layers provided by the preferred process offer a significant advantage over the significantly thicker prior assemblies which must conform to the conventional thickness limitations.

Flexibility and reliability are also benefited by the adhesiveless through hole metallization process beyond its thinner conductive layers. It has been found that the surface of the conductive material which is bonded to the substrate by the preferred process has a desirable surface profile which aids in flexibility and in maintaining a more reliable delamination resistant connection with the base substrate material. This is important because it has been found that one important factor in determining flexibility and reliability of a conductive layer is the surface profile of the conductive material joined to a dielectric base substrate material.

Electrodeposited (ED) conductive layers are generally not utilized in flexible circuits that are exposed to repeated flexures, such as in dynamic flex applications. This is generally due to the fact that electrodeposited copper typically has a rough surface facing the substrate material, which is generally necessary to form an adequate bond with the adhesive used. Even when used as a cast film, the surface of ED copper is generally rougher than is desirable for forming a reliable and flexible layer, which makes the layer susceptible to fracture from dynamic flexing.

Consequently, current commercial practice uses rolled annealed (RA) conductive layers (class 7) for dynamic applications. The surface of RA conductive material such as copper is much smoother than ED copper, which generally provides better flexibility. The economic limit, however, of RA copper in a conductive layer is about 17 microns in thickness. Reliability and cost concerns generally limit the production of RA copper layers much thinner than this lower limit.

On the other hand, the electrodeposited copper layers provided by the through hole metallization process described above have generally smoother surface profiles than even rolled annealed copper, and therefore have a comparable resistance to delamination from repeated flexing. It has been found that a conductive layer formed by the preferred process and comparable in thickness to rolled annealed copper has a fatigue ductility ($D_f$) of 110% versus 85% for RA copper. Further, the failure rate of this layer around a 0.078 inch mandrel was 470 cycles versus 289 cycles for RA copper. Consequently, at equivalent thicknesses, the conductive layers manufactured by the preferred method are generally superior to the rolled annealed copper layers. However, given that the preferred process may be used to deposit significantly thinner conductive layers on a substrate than the rolled annealed process, the reliability may be significantly greater due to the flexibility benefits obtained by reduced thicknesses. Further, another benefit over the RA process is that there is no concern for the orientation of the tracings with the preferred process since the copper layers formed thereby are isotropic in nature, unlike those formed by the rolled annealed process.

Using a 50 micron polyimide dielectric film, double-sided laminates of at most about 120 microns, preferably at most about 80 microns, and most preferably at most about 60 microns may be formed, which is generally a two- to three-fold improvement over many prior processes. Further, by utilizing 25 micron polyimide dielectric film, the thickness of a double-sided laminate may be further decreased to a thickness of at most about 35 microns. Consequently, significant improvements in thinness, flexibility and reliability are obtained by using the above-described preferred through hole metallization process consistent with the invention.

Dielectric Coverlayers

Prior to interconnecting the double-sided metallized through hole laminates 35, 45, and 55, it is preferable to coat one or both sides of these laminates with coverlayers of dielectric material in order to provide electrical insulation and environmental resistance. In the preferred embodiment, dielectric coverlayers 60 and 62 are coated over conductive layers 20 and 22 on laminate 35. Similarly, coverlayers 64 and 66 are coated over conductive layers 24 and 26 of laminate 45, and coverlayers 67 and 68 are coated over conductive layers 67 and 68 of laminate 55.

Dielectric coverlayers 60 and 68 operate to protect flexible multilayer printed circuit board 10 from the external environment. The remaining coverlayers 62, 64, 66 and 67 provide insulation across the conductive adhesive layers 70 and 80. Both opposing conductive layers across a conductive adhesive layer may be insulated by dielectric coverlayers. Alternatively, one of these layers may be omitted to further reduce the thickness of the laminates. However, it has been found that two coverlayers provide sufficient electrical insulation across a conductive adhesive layer.

Referring to laminate 35, dielectric coverlayers 60 and 62 are preferably selectively screen-printed over conductive layers 20 and 22, with a number of apertures defined by the screen in order to provide external access to contact pads on the conductive layers at a number of predetermined points. Alternatively, the dielectric ink used to form dielectric coverlayers 60 and 62 may be applied by means of a flooding screen print operation, where the dielectric ink is printed over the entire surface of the dielectric layers followed by a laser or selective chemical etching step to cut apertures into the dielectric coverlayers at desired points. Other methods of cutting apertures such as mechanical abrasion or micro-sandblasting may also be used. The dielectric ink may also be applied using a continuous roll-to-roll process, such as barcoating or spraying. Further, the dielectric ink may be casted into a b-stage layer, punched to form the apertures, and then applied to the surfaces of the conductive layers 20 and 22. Other known ink application processes may be used in the alternative.

The dielectric ink is preferably a polyimide ink. A wetting agent and/or anti-foam agent may be added to the ink. Other dielectric materials which readily form inks may also be used.

Once the dielectric ink material is applied onto the surfaces of conductive layers 20 and 22, the assemblies are preferably dried and cured in an oven. Preferably, drying occurs at a temperature in the range of 135° C. for a dwell time of approximately 7 to 10 minutes. Curing occurs at about 270° C. for a dwell time of about 2 minutes. One skilled in the art will appreciate that various dielectric inks will have different dry and cure processing requirements.

In some instances, it may be preferable to treat the cured dielectric coverlayers 60 and 62 to improve the ability of the dielectric material to bond to conductive adhesive material. This treatment is especially useful for dielectric coverlayers coated over internal signal layers, such as coverlayer 62, where the dielectric coverlayer bonds with a conductive adhesive layer in the final assembly. However, for the external dielectric coverlayers, such as dielectric coverlayers 60 and 68, the treatment is not required, although it may nonetheless be performed.

The preferred treatment of the dielectric coverlayers includes a first treatment with an alkaline solution such as sodium hydroxide, followed by a subsequent treatment with a bonding agent such as 0.5% Union Carbide A-187 or Dow Corning Z-6040 in a solution of methyl alcohol. These steps are useful for ensuring good adhesion of the dielectric coverlayer to a conductive adhesive, since during cure, an antifoam agent which is a component of the polyimide ink in the dielectric coverlayers tends to rise to the surface of these coverlayers and impede adhesion. In prior dielectric layers, this is usually not a concern, since it is beneficial to have non-adhesive dielectric material as no adhesive bonds with the dielectric material in the final assemblies. However, since good adhesion is a desirable feature of the dielectric coverlayers used with the present invention, this treatment step significantly improves the performance of the preferred assemblies.

The dielectric coverlayers have a thickness in the range of at most about 50 microns, preferably at most about 25 microns, more preferably at most about 10 microns, and most preferably at most about 5 microns. Often, the determinate factor for the thickness of these layers will be the amount of dielectric protection which is needed for the particular application.

The screen-printed dielectric coverlayers offer a number of advantages over many prior coverlayer designs. In particular, dielectric coverlayers of the prior art are typically dielectric films which are applied to a substrate by means of an adhesive material, similar to the prior applications of conductive layers on substrates as discussed above.

One advantage provided by screen printing polyimide ink into dielectric coverlayers is that much thinner coverlayers may be applied than heretofore has generally been used in the prior art. Primarily due to the elimination of adhesive, adequate dielectric protection can be provided in 5 microns or less of dielectric ink, as opposed to prior adhesive/film coverlayers which generally are about 25–50 microns thick. The elimination of adhesives also provides advantages in terms of thermal stress and chemical stability, as it is the adhesive which is typically unmatched with a dielectric substrate in terms of CTE, and which is more susceptible to chemical or thermal degradation. Due to the elimination of adhesive in the screen printing process, the dielectric coverlayers have essentially the same CTE, as well as the same chemical and thermal resistance as the dielectric substrate material.

It has been found that the screen-printed polyimide ink provides excellent insulation resistance and breakdown voltage. For example, two conductive layers, each coated with 5 microns of screen-printed polyimide ink, were connected by a conductive adhesive similar to the composition discussed below. Testing of 200 samples in a designed experiment revealed that the dielectric coverlayers provided in excess of 2.0 million megohms of insulation resistance (with a low value of 1.6 million megohms), and provided in excess of 1300 volts breakdown voltage (with a low value of 765 volts). These insulation characteristics are more than adequate for most applications.

It may be seen, therefore, that through the use of the through hole metallization and dielectric coverlayer screen-printing processes, a completely adhesiveless thin double-sided laminate may be fabricated consistent with the invention. Using a 50 micron polyimide substrate, such laminates may be produced having overall thicknesses of at most about 170 microns, more preferably at most about 100 microns, and most preferably at most about 70 microns. Lower values may even be obtained with thinner substrates. Greater packing density and greater resistance to thermal stress and chemical degradation is also provided. Further, higher flexibility and reliability may be obtained over other prior methods, which makes the preferred laminates especially suitable for use in flexible and dynamic applications.

Conductive Adhesive

In the preferred assembly 10, a number of finished double-sided laminates are electrically and mechanically joined by means of conductive adhesive layers disposed therebetween. As discussed generally for example in U.S. patent application Ser. No. 08/001,811, the conductive adhesive, also known as an anisotropic adhesive, is used to form multilayer constructions from two or more double-sided printed circuit assemblies or laminates.

With regard to assembly 10, shown in FIGS. 1 and 2, laminates 35, 45 and 55 are preferably interconnected by conductive adhesive layers 70 and 80. The conductive adhesive layers 70 and 80 provide secure mechanical interconnections between the double-sided metal-film laminates, and provide electrical interconnection only in the Z-axis (i.e., through the thickness thereof), while providing electrical insulation in the X and Y axes (i.e., throughout the plane of the layer). These layers are also referred to as anisotropic adhesive layers.

Generally, the conductive adhesive material used to form layers 70 and 80 includes a plurality of deformable heat fusible conductive particles disposed in a thermosetting polymer matrix. The conductive particles are preferably solder balls which are sized to span the connected distance between the opposing conductive layers, generally varying from this distance by no more than 10%; however, relatively larger or smaller particles may be utilized with sufficient reliability for many applications. It is also desirable to match the coefficient of thermal expansion of these particles with the dielectric substrate material to provide greater resistance to thermal stresses. Preferably, the CTE of the solder particles should be within 25% of the CTE of the dielectric substrate.

The preferred solder particles are formed of a eutectic solder such as 63:37 tin/lead, or alternatively 62.5:36.1:1.4 tin/lead/silver. It has been found that these compositions have relatively low melting points so that the solder particles are capable of being reflowed without subjecting any of the printed circuit assemblies to excessive temperatures. Other particle compositions may include alloys of indium or bismuth, or various solder combinations thereof. Consequently, depending on the thermal characteristics of the assemblies, various solder compositions may be utilized in order to provide the desired properties for the conductive adhesive.

It may also be preferable to include a number of smaller particles in addition to the primary particles sized to span the connected distance between opposing conductive layers. These smaller particles have been found to facilitate the formation of reliable interconnections in the adhesive layer. In a preferred embodiment, equal parts of −325 to +400 mesh powder and −500 mesh powder are used in the conductive adhesive material. The mixture of particles will tend to vary depending on the particular application desired.

The adhesive material used in the conductive adhesive is preferably dielectric, and may be any non-conducting plastic, resin, ceramic or glass material. It is preferable that the adhesive completely coat all of the particles so as to isolate each electrically from adjacent particles, and to protect each from contact from forces applied to the adhesive during assembly. The preferred adhesive is a thermosetting plastic suitable for screen printing.

One preferred conductive adhesive includes a base resin which is combined with phenolic resin and solder particles. The preferred base resin has the following composition:

| Ingredient | % Weight |
| --- | --- |
| Butvar 90 (Polyvinyl) | 74.78 |
| Cab-o-sil (Filler) | 7.79 |
| Antifoam A (Wetting Agent) | 1.24 |
| Epon 872 × 75 (Epoxy) | 16.19 |

The base resin is mixed with phenolic resin and conductive particles. Preferably, the conductive particles represent about 10 to about 30% by weight of the final composition. The loading of these particles is determined statistically, and must be sufficient to ensure adequate contact between opposing conductive layers where electrical interconnection is desired, but not so high as to exceed critical volume loading where not all of the solder particles are completely coated by the adhesive. While the precise loading of solder particles will vary depending upon the particular application used, the preferred conductive adhesive has the following composition:

| Ingredient | % Weight |
| --- | --- |
| Base Resin | 70.30 |
| BLS 2700 (Phenolic Resin) | 5.80 |
| Conductive Particles | 23.90 |

For each connection between double-sided laminates, the conductive adhesive material is preferably screen-printed onto one of the laminates. Alternatively, the conductive adhesive may be selectively screen-printed to certain areas of the circuit assembly, or flood screen-printed with areas removed by laser etching or otherwise. The conductive adhesive may also be formed into a b-stage film, where it may then be cut, drilled, punched, etc. to form apertures. Other known manners of applying an adhesive may also be used. After the conductive adhesive is screen-printed in the preferred process, it is next dried to a b-stage adhesive in an oven set at about 220°–250° F. for approximately 10 minutes. Next, all of the double-sided laminate assemblies (35, 45, 55) are aligned overlapping with one another, preferably using alignment pins which have been preformed during the manufacture of the assemblies. Next, the entire assembly 10 is laminated to cure and set the conductive adhesive layers 70 and 80. Preferably, this is performed at about 300 psi pressure and about 380° F. for about 50–60 minutes, and cooled under pressure. One skilled in the art will appreciate that the lamination times, pressures, and temperatures will vary for the particular application involved.

Once laminated, conductive adhesive layers 70 and 80 electrically and mechanically join the double-sided metal-film laminates 35, 45 and 55. During lamination, the adhesive cures and sets, while the conductive particles reflow and wet to opposing contact pads formed on the opposing conductive layers. As shown in FIG. 3, the conductive particles tend to form solder bridges 90 between opposing paths which, by virtue of the setting of the adhesive, become locked in place at the completion of the lamination process. Due to the thermosetting nature of the adhesive, any subsequent heating sufficient to reflow the solder will not cause these solder bridges to fail, as the surface tension of the solder, as well as the nature of the adhesive, will keep these bridges together. Consequently, assemblies which utilize the preferred conductive adhesive are capable of withstanding the high temperatures associated with many post-processing assemblies (e.g., wave soldering or IR reflow) and associated with many extreme operating environments.

In the preferred embodiment, the conductive adhesive layers are about 25 microns thick. While the particles in the above-described composition are not sized to within 10% of this thickness, it has been found that sufficiently reliable connections may be formed. We believe, however, that using particles which conform to the 10% rule would generally provide more reliable interconnections.

The conductive adhesive layers also provide greater packaging density, flexibility and design options over the prior interconnection methods. Previously, high aspect ratio through holes, extending throughout the thickness of a multilayer circuit, were required to interconnect layers in an assembly. These through holes require additional plating, and are highly susceptible to failure from flexing due to their longer lengths (spanning numerous layers). By virtue of the preferred conductive adhesive, however, individual internal interconnections, such as blind or buried vias, may be formed, limiting the use of through holes to merely connect conductive layers on opposing sides of a dielectric substrate (e.g., formed by the through hole metallization process). By proper circuit design, the space previously wasted by long through holes through multiple layers may be effectively used to allow for greater packaging densities for the various conductive layers. Gains of 25–40% in density are commonly obtained with the preferred process.

Further, as discussed, for example, in U.S. patent application Ser. No. 08/001,811, the conventional wisdom has required a 25:1 ratio between aperture size and the connected distance between opposing interconnecting pads on the conductive layers to ensure adequate electrical interconnections between opposing interconnecting pads using conductive adhesive layers. The aperture size typically determines the size of interconnecting pads on the conductive layers, and consequently, limits the packaging density obtainable in the conductive layers. This is generally the case with adhesive-based dielectric coverlayers since the 25:1 ratio allows for deformation of the opposing coverlayers during bonding since a Z-axis adhesive is generally ineffective at bridging relatively large distances. For instance, with a 50 micron connected distance, conventional wisdom requires a 1250 micron diameter aperture to ensure adequate performance of the conductive adhesive.

However, simply by using the screen-printed dielectric coverlayers discussed above, significant reductions in aperture size may be obtained. First, it has been found that, by using thinner coverlayers, much less deformation is required during lamination, as comparatively lesser distances must be spanned by the conductive adhesive. The ink may thus be non-compactible if desired without degrading the quality of connections. Consequently, it has been determined that a more reliable design rule may be utilized in the alternative which requires a 25 to 1 ratio between aperture size and the thickness of the dielectric coverlayer, rather than the connected distance between pads. Thus, using 5 micron dielectric coverlayers on each opposing conductive layer, aperture sizes of 250 microns (10 microns×25) provide reliable interconnections utilizing this alternative design rule.

While this aperture size reduction alone is a significant improvement over the prior art, it has been found that further improvements are obtained by virtue of the fact that the thinner dielectric ink requires less compression in order to ensure adequate bonding with the Z-axis adhesive. It has been found that the ratio of aperture size to dielectric coverlayer thickness may be decreased below the 25:1 ratio by using the dielectric ink as a coverlayer. In fact, we believe ratios as low as 20:1, and even as low as 12.5:1 or less, may be obtained, resulting in 125 micron apertures (10 microns× 12.5) using the above-described processes.

Sample assemblies constructed by the preferred processes were tested with varying sizes of interconnecting contact pads which terminated 125 micron conductive traces. It was found that, with as low as 125 micron pad sizes, when adequate resistance (less than 10 ohms) was obtained for the interconnections through the conductive adhesive, the current capacity of the circuits was not at all degraded by the 125 micron pad size (remaining at one amp or better regardless of pad size). While the aperture size itself was not set to 125 microns because of the limitations of the screen printing process used in the sample constructions, it is believed that using 125 micron apertures over these 125 micron pads would not significantly degrade the overall performance of these assemblies. Further, we believe that greater reliability in the interconnections between contact pads, and possibly a greater reduction in the possible aperture size ratio, would be obtainable through the use of smaller particles in the conductive adhesive material.

The primary benefit obtained by reducing the size of these apertures is the greater packaging density of the conductive traces in a conductive layer. This enables more traces to be included in the same amount of area of a conductive layer, and sometimes may be significant enough to eliminate the need for additional conductive layers. Consequently, it may be possible to provide more flexible and reliable circuits by reducing the aperture size as disclosed herein. Alternatively, it is possible to manufacture more complicated higher density circuits in the same area as previously used in the same area as without degrading flexibility and/or reliability.

Multilayer Circuit Performance

A number of unique benefits are obtained by the use of the various processes described above. One such benefit which has been realized is the reduction in thickness in preferred assemblies over prior art methods. Through the combination of the through hole metallization process, the dielectric coverlayer deposition, and the conductive adhesive bonding, significantly thinner flexible multilayer printed circuit assemblies may be formed than heretofore has generally been possible. For example, using 50 micron dielectric substrates, four layer multilayer circuits may be constructed having an overall thickness of at most about 365 microns (with 35 micron conductive layers and 25 micron dielectric coverlayers), more preferably at most about 225 microns (with 15 micron conductive layers and 10 micron dielectric coverlayers), and most preferably at most about 165 microns (with 5 micron conductive layers and dielectric coverlayers). The addition of another double-sided adhesiveless laminate and another conductive adhesive layer adds at most about 195 microns, more preferably at most about 125 microns, and most preferably at most about 95 microns. Thus, six layer multilayer circuits may be constructed with as little as 260 microns, and eight layer multilayer circuits may be constructed with as little as 355 microns.

By instead utilizing 25 micron dielectric substrates and only one dielectric coverlayer adjacent each layer of conductive adhesive, the overall thickness of a four layer multilayer circuit may be reduced to at most about 105 microns. Additional adhesiveless laminates secured by conductive adhesiveless laminates would then add at most about 65 microns to the overall thickness, therefore providing overall thicknesses of 170 microns for six layer circuits, and 235 microns for eight layer circuits.

These representative thicknesses for multilayer circuits exhibit significant advantages over the prior art. For instance, prior rigid circuits are limited to about a 800 micron thickness for a six layer circuit. Similarly, conventional FPC using 25 micron substrates can obtain only about a 653 micron thickness for a six layer construction. At best, using conventional flexible circuit fabrication technology, a six layer FPC may be produced with about a 500 micron thickness.

As discussed above, a reduction in thickness in a printed wiring circuit offers increased flexibility and reliability, which is particularly relevant to dynamic applications where a printed wiring hingeboard is subjected to multiple flexures over its lifetime. The reduction in thickness also results in significant material savings due to reduction in the types, as well as the quantities, of products required to manufacture the assemblies.

Other benefits are obtained by virtue of the above preferred fabrication processes. For instance, greater packaging density is available due to the reduction in aperture size in the dielectric coverlayers. This may often result in the elimination of conductive layers, and/or a reduction in the overall size of the conductive layers. It may also allow higher density circuits to be formed on similar sized substrates. Further, by use of blind or buried vias which interconnect various layers in the interior of a multilayer circuit assembly, overall packaging density may be reduced an additional 25–40% through proper circuit design.

Assemblies fabricated by the preferred processes also exhibit excellent thermal and chemical resistance. In particular, the assemblies are resistant to the high temperatures as well as the repeated thermal cycling that is commonly found in a number of post-processing assembly steps (e.g., soldering, IR reflow, roll tinning, hot air leveling, etc.) and in a number of extreme operating environments. Further, these assemblies exhibit resistance to harsh chemicals which often accompany many post-processing assembly steps, or which may be encountered in some operating environments (e.g., hot brake fluid in some antilock brake circuits).

One further advantage provided by these preferred manufacturing processes is improved thermal management capabilities resulting from the reduced thickness of the assemblies. The ability of a substrate to dissipate heat generated by devices attached thereto is in part a function of the thickness of the substrate. Consequently, the reduced thicknesses associated with these preferred manufacturing processes enable heat to be conducted away from integrated circuits and other devices attached to a substrate and consequently increase the life, reliability, and performance of those devices.

One further significant benefit realized by the present invention is the fact that adhesiveless metallized through hole laminates may be utilized in multilayer circuits. In the past, adhesiveless laminates were found to be unsuitable for use in multilayer circuitry. Primarily, this was the result of the inability of the thin copper inner layer in a through hole structure to withstand the high temperatures and pressures which were commonly associated with multilayer circuit assembly. One such example is the electroplating processes required in additive multilayer processes. In general, the copper layers and the plated through holes were found to be unreliable in prior multilayer circuits unless significantly thicker copper layers were utilized. While thicker layers might survive a prior multilayer process such as the additive process, the use of these thicker copper layers is counterproductive to flexibility and thinness, and hence is generally unsuitable for flexible multilayer circuitry.

However, through the use of conductive adhesive layers as an assembly technique for multilayer constructions, it has been found that the thin copper layers and holes provided by the above-described adhesiveless metallized through hole process may be utilized in a multilayer construction, principally due to the robustness of the metallized through holes. Therefore, one principal benefit of the invention is the realization that sufficient mechanical strength and reliability may still be maintained with thin metallized through hole constructions to form thin multilayer circuit assemblies.

Therefore, it can be seen that the present invention provides many significant advantages in the manufacture of high-quality, reliable flexible multilayer printed circuit boards. The above discussion, examples and embodiments illustrate our current understanding of the invention. However, one skilled in the art will appreciate that various changes may be made without departing from the spirit and scope of the invention. Thus, the invention resides wholly in the claims hereafter appended.

We claim:

1. A flexible multilayer printed circuit board, comprising:
   (a) at least two adhesiveless laminates, each adhesiveless laminate comprising:
      (i) a flexible dielectric substrate;
      (ii) first and second conductive layers of conductive material secured to opposing surfaces of the flexible dielectric substrate through adhesiveless interconnections; and
      (iii) at least one metallized through hole defined through the flexible dielectric substrate and having conductive material adhesivelessly deposited thereon to electrically interconnect the first and second conductive layers, wherein the conductive material deposited in the at least one metallized through hole has a thickness of less than about 25 microns; wherein the opposing surfaces of the flexible dielectric substrate of each adhesiveless laminate include non-continuous random distributions of metaloxide selected from the group consisting of oxides of iron, chromium, nickel, molybdenum, manganese, zirconium or mixtures thereof; and wherein the conductive material in the first and second conductive layers and the at least one metallized through hole is adhered to the flexible dielectric substrate through the non-continuous random distributions of metaloxide; and
   (b) a conductive adhesive layer, disposed between the adhesiveless laminates, for mechanically and electrically interconnecting the adhesiveless laminates in a superposed relationship with one another.

2. The flexible multilayer printed circuit board of claim 1, wherein the conductive material in the first and second conductive layers and the at least one metallized through hole comprises a first metal layer, formed on the random distributions by vapor metallization, having a thickness of about 50 to 500 nanometers, and a second metal layer electroplated on the first metal layer.

3. The flexible multilayer printed circuit board of claim 2, wherein the conductive material in the first and second conductive layers is at most about 35 microns in thickness.

4. The flexible multilayer printed circuit board of claim 3, wherein the conductive material in the first and second conductive layers and the at least one metallized through hole comprises copper having a thickness of at most about 5 microns.

5. The flexible multilayer printed circuit board of claim 1, wherein the conductive material deposited in the at least one metallized through hole has a thickness of less than about 12.5 microns.

6. The flexible multilayer printed circuit board of claim 1, wherein the peel strengths of the adhesiveless laminates are at least 2 pounds per inch.

7. The flexible multilayer printed circuit board of claim 1, wherein the flexible dielectric substrate comprises a polyimide film having a thickness of at most about 50 microns, and wherein the flexible dielectric substrate and the first and second conductive layers have substantially similar coefficients of thermal expansion.

8. The flexible multilayer printed circuit board of claim 1, wherein the conductive adhesive layer is interposed between the first conductive layers on the at least two adhesiveless laminates to mechanically connect the at least two adhesiveless laminates in a superposed relationship with a connected distance therebetween, and to electrically connect the first conductive layers on the at least two adhesiveless laminates; the conductive adhesive layer being conductive across a thickness thereof and being non-conductive throughout a coplanar direction thereof, and being disposed substantially throughout an overlapping portion of the two first conductive layers; the conductive adhesive layer comprising a non-conductive adhesive having a first plurality of deformable conductive metallic particles dispersed substantially uniformly throughout the adhesive such that each particle is electrically insulated from substantially every other particle, the particles and the flexible dielectric substrates having a substantially similar coefficient of thermal expansion.

9. The flexible multilayer printed circuit board of claim 8, wherein the particles in the conductive adhesive layer have a diameter that is about 90–110% of the distance between the first conductive layers on the at least two adhesiveless laminates.

10. The flexible multilayer printed circuit board of claim 8, wherein the non-conductive adhesive is a thermosetting resin.

11. The flexible multilayer printed circuit board of claim 8, wherein the conductive adhesive layer further comprises a second plurality of deformable conductive metallic particles having diameters smaller than the first plurality of particles.

12. The flexible multilayer printed circuit board of claim 8, wherein the particles are made of substantially spherical eutectic solder comprising 62.5:36.1:1.4 tin/lead/silver, and wherein at least 80 percent of the particles have a diameter within 20 percent of a mean diameter.

13. The flexible multilayer printed circuit board of claim 8, wherein the conductive adhesive layer is at most about 25 microns in thickness.

14. A flexible multilayer printed circuit board, comprising:
  (a) at least two adhesiveless laminates, each adhesiveless laminate comprising:
    (i) a flexible dielectric substrate;
    (ii) first and second conductive layers of conductive material secured to opposing surfaces of the flexible dielectric substrate through adhesiveless interconnections; and
    (iii) at least one metallized through hole defined through the flexible dielectric substrate and having conductive material adhesivelessly deposited thereon to electrically interconnect the first and second conductive layers, wherein the conductive material deposited in the at least one metallized through hole has a thickness of less than about 25 microns;
  (b) a conductive adhesive layer, disposed between the adhesiveless laminates, for mechanically and electrically interconnecting the adhesiveless laminates in a superposed relationship with one another; and
  (c) at least one adhesiveless dielectric layer disposed on at least one of the adhesiveless laminates between one of the conductive layers on the adhesiveless laminate and the conductive adhesive layer.

15. The flexible multilayer printed circuit board of claim 14, wherein the adhesiveless dielectric layer comprises a cured polyimide ink printed to a thickness of at most about 5 microns.

16. The flexible multilayer printed circuit board of claim 14, wherein the first conductive layers on the at least two adhesiveless laminates are oppositely disposed across the conductive adhesive layer such that at least one pair of opposing interconnecting pads defined on the first conductive layers are oppositely disposed across the conductive adhesive layer, and wherein the adhesiveless dielectric layer is configured to define at least one aperture oriented to enable the conductive adhesive layer to electrically connect the at least one pair of interconnecting pads.

17. The flexible multilayer printed circuit board of claim 16, wherein the at least one aperture has a diameter of less than about 25 times the thickness of the adhesiveless dielectric layer.

18. The flexible multilayer printed circuit board of claim 14, wherein the combined thickness of the adhesiveless laminates, the at least one adhesiveless dielectric layer and the conductive adhesive layer is at most about 365 microns.

19. The flexible multilayer printed circuit board of claim 18, wherein the additional combined thickness of an additional adhesiveless laminate, at least one additional adhesiveless dielectric layer, and an additional conductive adhesive layer is at most about 195 microns.

20. The flexible multilayer printed circuit board of claim 18, wherein the combined thickness of the adhesiveless laminates, the at least one adhesiveless dielectric layer and the conductive adhesive layer is at most about 225 microns.

21. The flexible multilayer printed circuit board of claim 20, wherein the additional combined thickness of an additional adhesiveless laminate, at least one additional adhesiveless dielectric layer, and an additional conductive adhesive layer is at most about 125 microns.

22. The flexible multilayer printed circuit board of claim 20, wherein the combined thickness of the adhesiveless laminates, the at least one adhesiveless dielectric layer and the conductive adhesive layer is at most about 165 microns.

23. The flexible multilayer printed circuit board of claim 22, wherein the additional combined thickness of an additional adhesiveless laminate, at least one additional adhesiveless dielectric layer, and an additional conductive adhesive layer is at most about 95 microns.

24. The flexible multilayer printed circuit board of claim 22, wherein the combined thickness of the adhesiveless laminates, the at least one adhesiveless dielectric layer and the conductive adhesive layer is at most about 105 microns.

25. The flexible multilayer printed circuit board of claim 24, wherein the additional combined thickness of an additional adhesiveless laminate, at least one additional adhesiveless dielectric layer, and an additional conductive adhesive layer is at most about 65 microns.

26. The flexible multilayer printed circuit board of claim 14, further comprising a second adhesiveless dielectric layer disposed on the other of the adhesiveless laminates between the first conductive layer on the other adhesiveless laminate and the conductive adhesive layer; whereby the conductive adhesive layer is interposed between the first and second adhesiveless dielectric layers.

27. The flexible multilayer printed circuit board of claim 26, further comprising third and fourth adhesiveless dielectric layers disposed over the second conductive layers on each of the adhesiveless laminates, respectively.

28. A metal-film laminate for use in a flexible multilayer printed circuit board, comprising:
  (a) a flexible dielectric substrate having opposing surfaces bearing non-continuous random distributions of metal-oxide;
  (b) first and second conductive layers of conductive material secured to the opposing surfaces of the flexible dielectric substrate through the non-continuous random distributions of metal-oxide; and
  (c) at least one metallized through hole defined through the flexible dielectric substrate and having conductive material adhesivelessly deposited thereon integrally with the conductive material in the first and second conductive layers to electrically interconnect the first and second conductive layers, wherein the conductive material deposited in the at least one metallized through hole has a thickness of less than about 25 microns, and wherein the first and second conductive layers and the at least one metallized through hole have a delamination resistance sufficient to withstand conductive adhesive lamination.

29. The metal-film laminate of claim 28, wherein the non-continuous random distributions of metal-oxide include metal-oxides selected from the group consisting of oxides of iron, chromium, nickel, molybdenum, manganese, zirconium or mixtures thereof.

30. The metal-film laminate of claim 29, wherein the conductive material in the first and second conductive layers and the at least one metallized through hole comprises a first metal layer, formed on the random distributions by vapor metallization, having a thickness of about 50 to 500 nanometers, and a second metal layer deposited on the first metal layer.

31. The metal-film laminate of claim 30, wherein the conductive material in the first and second conductive layers is at most about 35 microns in thickness.

32. The metal-film laminate of claim 31, wherein the conductive material in the first and second conductive layers and the at least one metallized through hole comprises copper having a thickness of at most about 5 microns.

33. The metal-film laminate of claim 30, wherein the second metal layer of conductive material in the first and second conductive layers and the at least one metallized through hole is formed by electroplating.

34. The metal-film laminate of claim 28, wherein the peel strength of the adhesiveless laminates is at least 2 pounds per inch.

35. The metal-film laminate of claim 28, wherein the flexible dielectric substrate comprises a polyimide film having a thickness of at most about 50 microns.

36. The metal-film laminate of claim 28, further comprising at least one adhesiveless dielectric layer disposed over at least one of the first and second conductive layers on the adhesiveless laminate.

37. The metal-film laminate of claim 36, wherein the flexible dielectric substrate, the conductive material and the at least one adhesiveless dielectric layer have substantially similar coefficients of thermal expansion.

38. The metal-film laminate of claim 36, wherein the adhesiveless dielectric layer comprises a screen printable polyimide ink printed to a thickness of at most about 5 microns.

39. The metal-film laminate of claim 36, wherein the adhesiveless dielectric layer is configured to define at least one aperture oriented to expose an interconnecting pad defined on the at least one of the first and second conductive layers upon which the adhesiveless dielectric layer is disposed.

40. The metal-film laminate of claim 36, wherein the adhesiveless dielectric layer comprises first and second adhesiveless dielectric layers disposed on the first and second conductive layers, respectively, and wherein the combined thickness of the flexible dielectric substrate, the first and second conductive layers and the first and second adhesiveless dielectric layers is at most about 170 microns.

41. The metal-film laminate of claim 40, wherein the combined thickness of the flexible dielectric substrate, the first and second conductive layers and the first and second adhesiveless dielectric layers is at most about 100 microns.

42. The metal-film laminate of claim 41, wherein the combined thickness of the flexible dielectric substrate, the first and second conductive layers and the first and second adhesiveless dielectric layers is at most about 70 microns.

43. The metal-film laminate of claim 28, wherein the combined thickness of the flexible dielectric substrate and the first and second conductive layers is at most about 120 microns.

44. The metal-film laminate of claim 43, wherein the combined thickness of the flexible dielectric substrate and the first and second conductive layers is at most about 80 microns.

45. The metal-film laminate of claim 44, wherein the combined thickness of the flexible dielectric substrate and the first and second conductive layers is at most about 35 microns.

46. A flexible multilayer printed circuit board, comprising:

(a) at least two adhesiveless laminates, each adhesiveless laminate including at least one conductive layer disposed on a surface of a flexible dielectric substrate and having an interconnecting pad defined thereon corresponding with an interconnecting pad on the other adhesiveless laminate, at least one of the two adhesiveless laminates having two conductive layers disposed on opposing surfaces of the flexible dielectric layer; wherein at least one of the adhesiveless laminates includes conductive layers disposed on opposing surfaces of the flexible dielectric substrate and at least one metallized through hole defined through the flexible dielectric substrate and having conductive material deposited thereon to electrically interconnect the conductive layers on the opposing surfaces of the flexible dielectric substrate, wherein the conductive material deposited in the at least one metallized through hole has a thickness of less than about 25 microns, wherein the opposing surfaces of the flexible dielectric substrate with the at least one metallized through hole include non-continuous random distributions of metal-oxide selected from the group consisting of oxides of iron, chromium, nickel, molybdenum, manganese, zirconium or mixtures thereof, and wherein the conductive layers on the opposing surfaces of the flexible dielectric substrate and the conductive material in the at least one metallized through hole are adhered to the flexible dielectric substrate through the non-continuous random distributions of metal-oxide such that the peel strengths of the adhesiveless laminates are at least 2 pounds per inch (b) an adhesiveless dielectric layer disposed on one of the adhesiveless laminates over one of the conductive layers, the adhesiveless dielectric layer defining at least one aperture aligned with the interconnecting pad on the conductive layer and having a diameter of less than about 25 times the thickness of the adhesiveless dielectric layer; and (c) interconnecting means for mechanically securing the at least two adhesiveless laminates together in a superposed relationship with interconnecting pads oppositely disposed from one other and with the adhesiveless dielectric layer disposed between the interconnecting means and one of the conductive layers with the aperture aligned with the interconnecting pads.

47. The flexible multilayer printed circuit board of claim 46, wherein the adhesiveless dielectric layer comprises a screen printable dielectric ink printed to a thickness of at most about 25 microns.

48. The flexible multilayer printed circuit board of claim 47, wherein the dielectric ink is printed to a thickness of at most about 10 microns.

49. The flexible multilayer printed circuit board of claim 48 wherein the screen printable dielectric ink comprises a polyimide ink printed to a thickness of at most about 5 microns.

50. The flexible multilayer printed circuit board of claim 46, wherein the adhesiveless dielectric layer is generally non-compactible.

51. The flexible multilayer printed circuit board of claim 46, wherein the at least one aperture has a diameter of at most about 12.5 times the thickness of the adhesiveless dielectric layer.

52. The flexible multilayer printed circuit board of claim 46, wherein the at least one aperture has a diameter of less than about 1250 microns.

53. The flexible multilayer printed circuit board of claim 52, wherein the at least one aperture has a diameter of at most about 125 microns.

54. The flexible multilayer printed circuit board of claim 46, wherein the interconnecting means comprises a conductive adhesive layer interposed between the conductive layers on the at least two adhesiveless laminates to mechanically connect the at least two adhesiveless laminates in a superposed relationship with a connected distance therebetween, and to electrically connect the conductive layers on the at least two adhesiveless laminates, the conductive adhesive layer being conductive across a thickness thereof and being non-conductive throughout a coplanar direction thereof, and being disposed substantially throughout an overlapping portion of the at least two adhesiveless laminates, the conductive adhesive layer comprising a non-conductive adhesive having a first plurality of deformable conductive metallic particles dispersed substantially uniformly throughout the adhesive such that each particle is electrically insulated from substantially every other particle, the particles and the flexible dielectric substrates of the adhesiveless laminates having a substantially similar coefficient of thermal expansion.

55. A flexible multilayer printed circuit board, comprising:

(a) at least two adhesiveless laminates, each adhesiveless laminate including at least one conductive layer disposed on a surface of a flexible dielectric substrate, at least one of the two adhesiveless laminates having two conductive layers disposed on opposing surfaces of the flexible dielectric layer and at least one metallized through hole electrically interconnecting the two conductive layers through the flexible dielectric layer and having conductive material adhesivelessly deposited to a thickness of less than about 25 microns, wherein the opposing surfaces of the flexible dielectric substrate having two conductive layers include non-continuous random distributions of metal-oxide selected from the group consisting of oxides of iron, chromium, nickel, molybdenum, manganese, zirconium or mixtures thereof; and wherein the conductive material in the two conductive layers and the at least one metallized through hole is adhered to the flexible dielectric substrate through the non-continuous random distributions of metal-oxide;

(b) an adhesiveless dielectric layer disposed on at least one of the adhesiveless laminates; and (c) interconnecting means for mechanically securing the at least two adhesiveless laminates together in a superposed relationship with the adhesiveless dielectric layer disposed between the interconnecting means and one of the conductive layers.

56. A flexible multilayer printed circuit board, comprising:

(a) at least two adhesiveless laminates, each adhesiveless laminate comprising:

(i) a flexible dielectric substrate comprising a polyimide film having at least one through hole defined therethrough, a thickness of at most about 50 microns and opposing surfaces which include non-continuous random distributions of metal-oxide selected from the group consisting of oxides of iron, chromium, nickel, molybdenum, manganese, zirconium or mixtures thereof;

(ii) copper deposited on the flexible dielectric substrate to form first and second copper layers on the opposing surfaces of the flexible dielectric substrate and to interconnect the first and second copper layers by metallizing the at least one through hole, wherein the copper in the first and second copper layers and the at least one through hole comprises a first copper layer, formed on the random distributions by vapor metallization, having a thickness of about 50 to 500 nanometers, and a second copper layer electroplated on the first copper layer, wherein the copper in the first and second copper layers and the at least one through hole has a thickness of at most about 5 microns, and wherein the peel strengths of the adhesiveless laminates are at least 2 pounds per inch; and (iii) adhesiveless dielectric layers disposed on the opposing surfaces of the flexible dielectric substrate over the first and second copper layers, wherein each adhesiveless dielectric layer comprises a screen printed polyimide printed to a thickness of at most about 5 microns, wherein the flexible dielectric substrate, the copper and the adhesiveless dielectric layers have substantially similar coefficients of thermal expansion;

(b) a conductive adhesive layer, disposed between the at least two adhesiveless laminates such that the first copper layers thereon are opposed across the conductive adhesive layer, for mechanically connecting the at least two adhesiveless laminates in a superposed relationship with a connected distance therebetween and electrically interconnecting the first copper layers, the conductive adhesive layer being conductive across a thickness thereof and being non-conductive throughout a coplanar direction thereof, and being disposed substantially throughout an overlapping portion of the two first copper layers, the conductive adhesive layer comprising a non-conductive thermosetting adhesive having a plurality of deformable conductive metallic particles dispersed substantially uniformly throughout the adhesive such that each particle is electrically insulated from substantially every other particle, the particles and the flexible dielectric substrates having a substantially similar coefficient of thermal expansion;

(c) wherein the adhesiveless dielectric layer disposed over the first copper layer on at least one of the adhesiveless laminates is configured to define at least one aperture which is oriented to expose an interconnecting pad on the first copper layer to facilitate an electrical connection between the interconnecting pad and an opposing interconnecting pad on the first copper layer opposite the conductive adhesive layer, the aperture being sized with a diameter which is less than 25 times the thickness of the adhesiveless dielectric layer; and (d) wherein the combined thickness of the adhesiveless laminates and the conductive adhesive layer is at most about 165 microns, and wherein the additional combined thickness of an additional adhesiveless laminate and an additional conductive adhesive layer is at most about 95 microns.

* * * * *